(12) United States Patent
Weaver et al.

(10) Patent No.: US 8,698,104 B2
(45) Date of Patent: Apr. 15, 2014

(54) SYSTEM AND METHOD FOR HANDLING MULTIPLE WORKPIECES FOR MATRIX CONFIGURATION PROCESSING

(75) Inventors: William T. Weaver, Austin, TX (US); Jaime A. Carrera, Austin, TX (US); Robert B. Vopat, Austin, TX (US); Aaron Webb, Austin, TX (US); Charles T. Carlson, Cedar Park, TX (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 199 days.

(21) Appl. No.: 12/941,656

(22) Filed: Nov. 8, 2010

(65) Prior Publication Data

US 2011/0108742 A1    May 12, 2011

Related U.S. Application Data

(60) Provisional application No. 61/259,242, filed on Nov. 9, 2009.

(51) Int. Cl.
*G01J 1/00* (2006.01)

(52) U.S. Cl.
USPC ........................................... 250/491.1

(58) Field of Classification Search
USPC ............ 250/491.1, 492.1, 492.2, 492.21, 250/442.11; 414/331.18, 222.01, 222.07, 414/225.01
See application file for complete search history.

(56) References Cited

U.S. PATENT DOCUMENTS

| | | | | |
|---|---|---|---|---|
| 2,128,854 A | * | 8/1938 | Sagendorph et al. | 211/126.1 |
| 3,643,807 A | * | 2/1972 | Childs | 211/10 |
| 4,141,458 A | * | 2/1979 | Brooks et al. | 414/331.18 |
| 4,508,968 A | * | 4/1985 | Kobayashi et al. | 250/441.11 |
| 4,705,951 A | * | 11/1987 | Layman et al. | 250/442.11 |
| 4,745,287 A | * | 5/1988 | Turner | 250/492.2 |
| 4,831,270 A | * | 5/1989 | Weisenberger | 250/492.2 |
| 5,004,924 A | * | 4/1991 | Imahashi | 250/442.11 |
| 5,334,246 A | * | 8/1994 | Pietrzykowski et al. | 118/69 |
| 5,497,888 A | * | 3/1996 | Michaels et al. | 211/10 |
| 6,036,426 A | | 3/2000 | Hillman | |
| 6,092,979 A | * | 7/2000 | Miselli | 414/790.7 |
| 6,414,328 B1 | * | 7/2002 | Nussupov | 250/492.21 |
| 6,933,511 B2 | * | 8/2005 | Yang et al. | 250/492.21 |
| 8,089,055 B2 | * | 1/2012 | Brailove | 250/492.2 |
| 8,143,595 B2 | * | 3/2012 | Tatemichi et al. | 250/453.11 |
| 2001/0007322 A1 | * | 7/2001 | Shei et al. | 219/399 |
| 2001/0048867 A1 | * | 12/2001 | Lebar et al. | 414/217 |

(Continued)

FOREIGN PATENT DOCUMENTS

| WO | 0157908 A2 | 8/2001 |
|---|---|---|
| WO | 2004009299 A2 | 1/2004 |
| WO | 2007029401 A1 | 3/2007 |

*Primary Examiner* — Phillip A Johnston
*Assistant Examiner* — Jason McCormack

(57) ABSTRACT

A system for loading workpieces into a process chamber for processing in a matrix configuration includes a conveyor configured to transport multiple workpieces in a linear fashion. A workpiece hotel is configured to receive the multiple workpieces from the conveyor. The workpiece hotel comprises a matrix of cells arranged in N columns and M floors. A pick blade is configured to insert into the hotel and retract from the hotel in order to unload a plurality of substrates from a first floor into a single row of the pick blade, and to repeat the unloading operation to form a matrix comprising a plurality of rows of substrates disposed on the pick blade. In one example, the workpiece hotel has a staggered configuration that provides individual accessibility of each hotel cell.

11 Claims, 11 Drawing Sheets

(56) References Cited

U.S. PATENT DOCUMENTS

| | | | |
|---|---|---|---|
| 2003/0188997 A1* | 10/2003 | Tan et al. | 209/538 |
| 2004/0240971 A1* | 12/2004 | Tezuka et al. | 414/217 |
| 2005/0280788 A1* | 12/2005 | Kuit et al. | 355/53 |
| 2006/0226093 A1 | 10/2006 | Cho et al. | |
| 2008/0098774 A1* | 5/2008 | Huang | 70/21 |
| 2009/0010742 A1* | 1/2009 | Stolzer | 414/281 |
| 2009/0101816 A1* | 4/2009 | Noji et al. | 250/310 |
| 2009/0196716 A1* | 8/2009 | Rebstock | 414/222.01 |

* cited by examiner

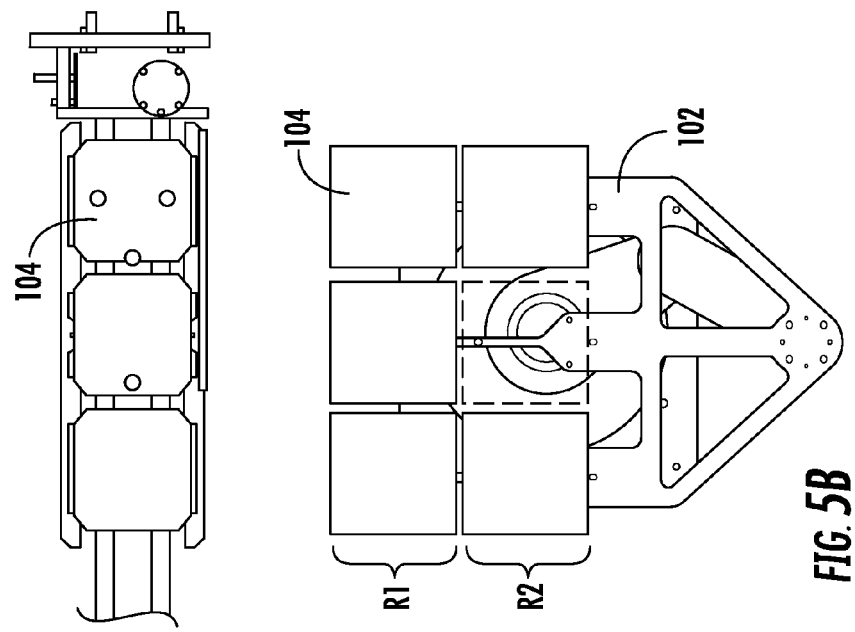
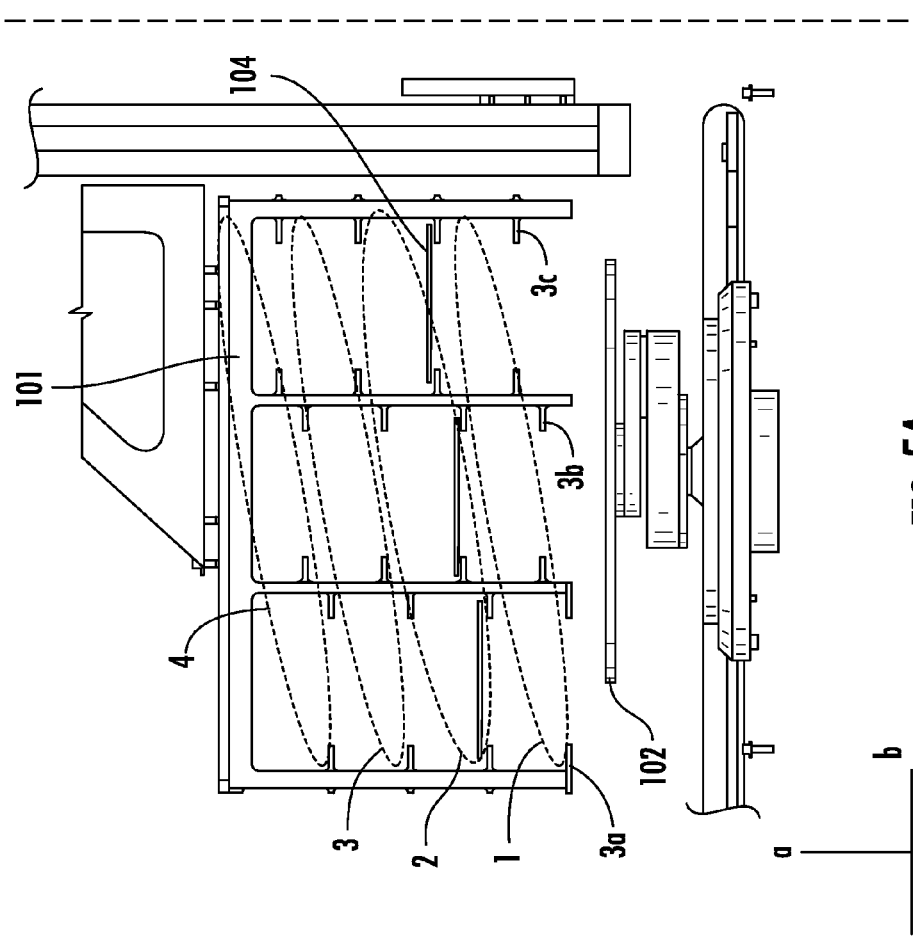
FIG. 5B
FIG. 5A

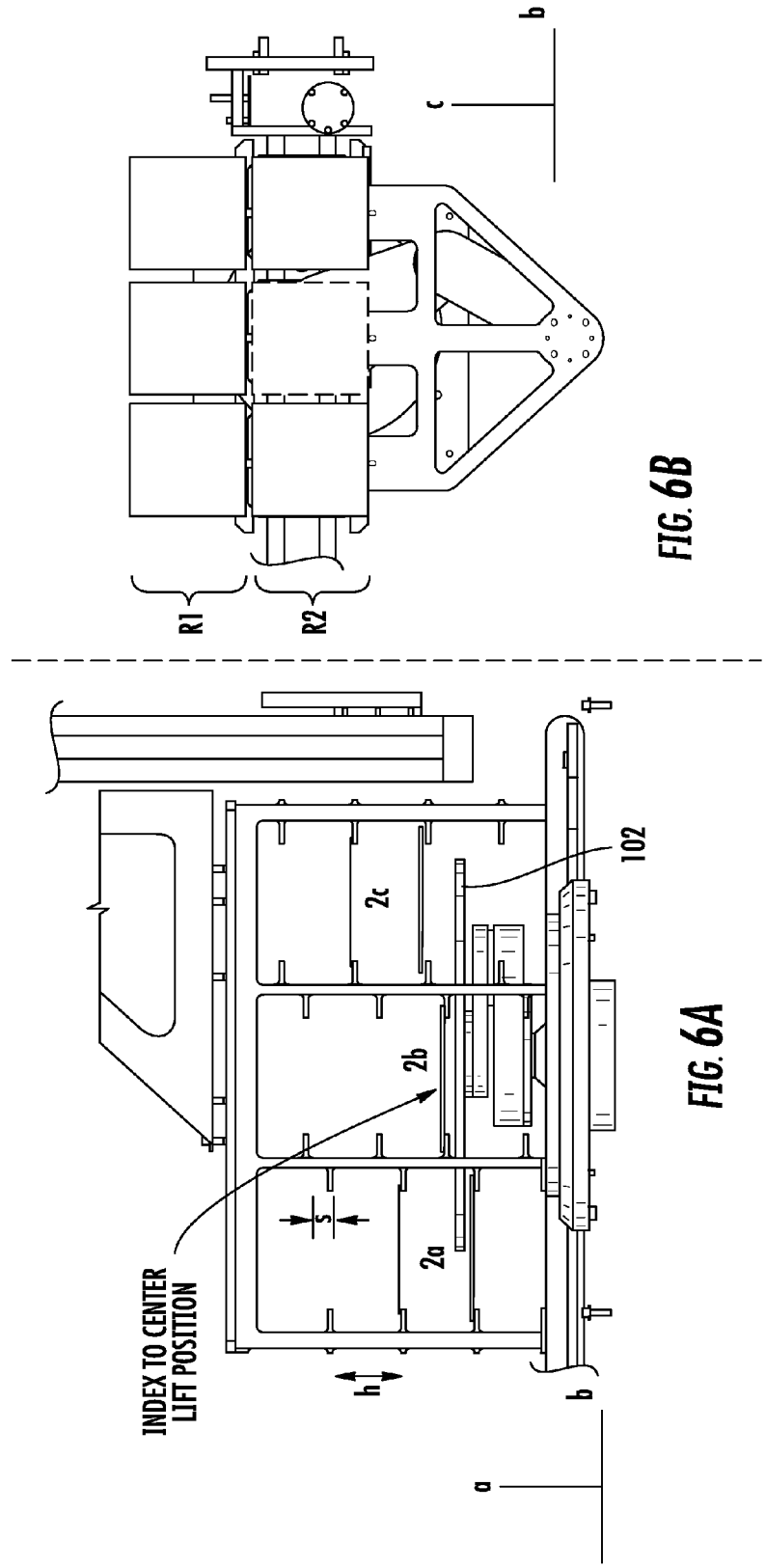

SYSTEM AND METHOD FOR HANDLING MULTIPLE WORKPIECES FOR MATRIX CONFIGURATION PROCESSING

This application claims the benefit of U.S. Provisional Patent Application No. 61/259,242, filed Nov. 9, 2009, which is incorporated by reference herein in its entirety.

FIELD

This invention relates to the transport of workpieces and, more particularly, to a method and apparatus to transport solar cells for processing in a matrix configuration.

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Doping may improve efficiency of solar cells. This doping may be performed using ion implantation. FIG. 1 is a cross-sectional view of a selective emitter solar cell. It may increase efficiency (the percentage of power converted and collected when connected to an electrical circuit) of a solar cell to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 100-300 µm across. FIG. 2 is a cross-sectional view of an interdigitated back contact (IBC) solar cell. In the IBC solar cell, the junction is on the back of the solar cell. The doping pattern is alternating p-type and n-type dopant regions in this particular embodiment. The p+ emitter 203 and the n+ back surface field 204 may be doped. This doping may enable the junction in the IBC solar cell to function or have increased efficiency.

To implant solar cells according to known techniques, solar cells are typically unloaded from a cassette and transferred to the implanter, and thereafter transferred from the implanter to holders for further processing. Known methods are either too slow, expensive, or unreliable. Accordingly, there is a need in the art for an improved method of transport for workpieces and, more particularly, an improved method and apparatus to transport solar cells.

SUMMARY OF THE INVENTION

Embodiments of the present disclosure are directed toward systems and methods for handling substrates to be processed in a matrix configuration. In an exemplary embodiments system for loading workpieces into a process chamber comprises a workpiece hotel defined by a matrix of cells arranged in N columns and M floors where each of the cells is configured to receive a workpiece. A pick blade is configured to insert into the hotel and retract from the hotel, wherein the pick blade is operable to unload a plurality of workpieces from a first of the M floors onto the pick blade, and to repeat the unloading operation to form a matrix comprising a plurality of rows of workpieces disposed on the pick blade.

In another exemplary embodiment, a method of handling substrates comprises loading a first plurality of substrates into at least a first of a plurality of floors of a substrate hotel, wherein each floor comprises a plurality of cells and each cell is configured to support a substrate. A second plurality of substrates are unloaded from the substrate hotel in a floor-by-floor fashion onto a pick blade, wherein the unloaded substrates form a two dimensional matrix of substrates on the pick blade.

BRIEF DESCRIPTION OF THE DRAWINGS

FIGS. 5a and 5b are schematic side and plan views, respectively, of an exemplary workpiece handling system illustrating a hotel, conveyor, and retracted pick blade with a missing workpiece;

FIGS. 6a and 6b are schematic side and plan views, respectively, of the exemplary workpiece handling system of FIG. 5a when the pick blade is inserted into the hotel;

DETAILED DESCRIPTION

Figure 1:
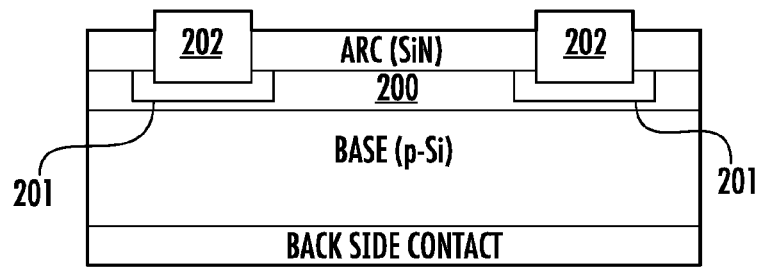
FIG. 1 is a cross-sectional view of a known selective emitter solar cell.
Figure 2:
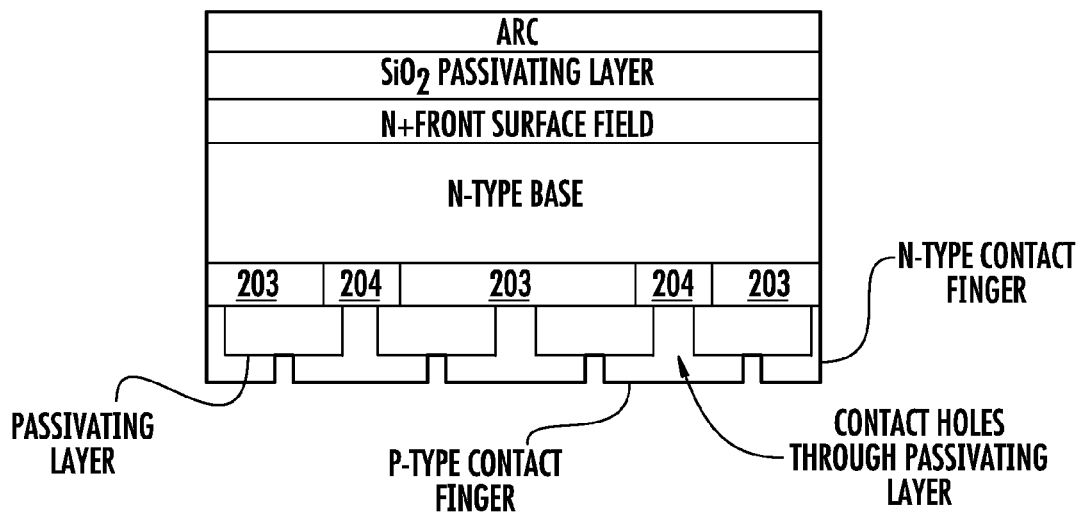
FIG. 2 is a cross-sectional view of a known interdigitated back contact solar cell.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. More particularly, workpieces, methods, and systems of and embodiments of this invention may be described herein in connection with solar cells. However, the embodiments of this invention can be used with, for example, semiconductor wafers or flat panels. Embodiments of this invention can be used with different types of ion implantation systems. The implanter may be, for example, a beamline or plasma doping ion implanter. Thus, the invention is not limited to the specific embodiments described below.

Figure 3A:
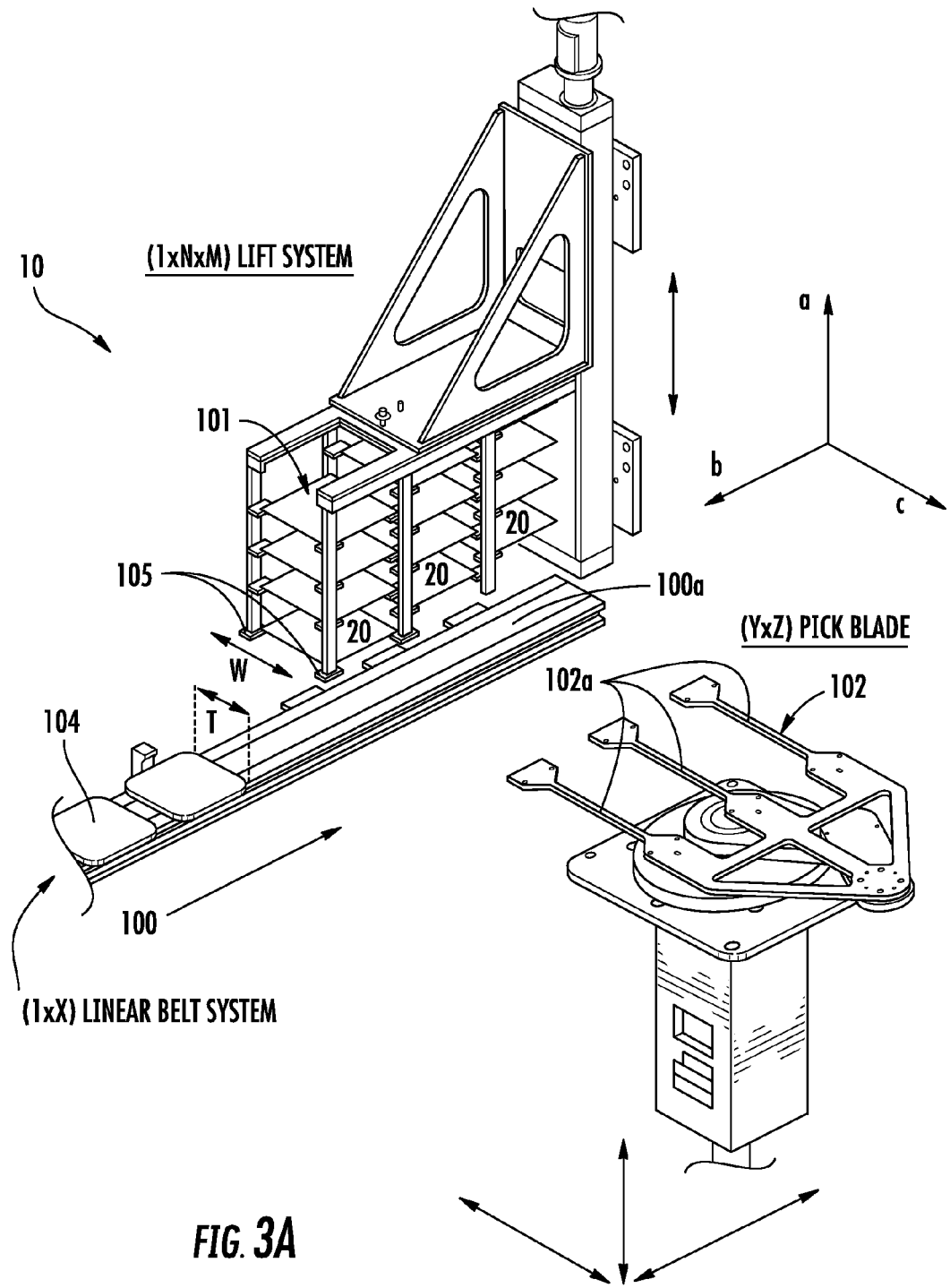
FIG. 3a is a perspective view of an exemplary workpiece handling system.

FIG. 3a1 is a perspective view of an exemplary workpiece handling system 10. As used herein, the terms "workpiece" and "substrate" may be used interchangeably. As described in more detail below, this handling system 10 may comprise a linear conveyor belt 100, two dimensional lift system 101, and two dimensional pick blade 102, which are operable to move workpieces 104 (which may be solar cells) from a cassette to an implanter. The term "pick blade," as used herein, refers to a component that acts as substrate transfer mechanism and may include a plurality of arms configured to insert into a plurality of compartments, such as the individual columns in lift system 101. In embodiments of the invention, a lift system and pick blade are used to supply workpieces to an ion implanter, such that a matrix of multiple workpieces 104 can be implanted during one implant referred to as a batch implantation. This matrix may be arranged in, for example, a 2×2, 2×3, or N×N manner. Thus, in one particular instance, the workpieces 104 are arranged in the process chamber of an implanter for implantation in a matrix that is two workpieces 104 wide and three workpieces 104 high.

Figure 14:
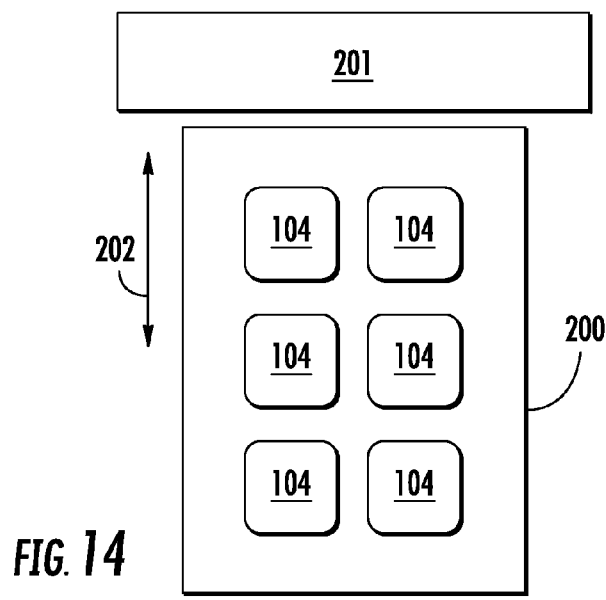
FIG. 14 is a plan view of workpieces on a platen.

FIG. 14 is a plan view of workpieces on a substrate platen 200 that may be used for ion implantation of substrates such as solar cells. The wafers 104 are arranged on the platen 200 in a 2×3 matrix. This platen 200 may hold the workpieces 104 using electrostatic or physical force. The platen may be oriented in a vertical manner or horizontal manner. To perform ion implantation, an ion beam 201 and the platen 200 may be translated with respect to one another as illustrated by the arrow 202. This may be a combination of ion beam 201 and platen 200 movements, or individual ion beam 201 or platen 200 movements. The workpieces 104 and platen 200 may be covered by a mask in one particular embodiment to allow implantation of particular regions of the workpieces 104. Blanket implants of the workpieces 104 without a mask also may be performed. The platen 200 may rotate or tilt to enable loading and unloading of the workpieces 104.

Figure 13A:
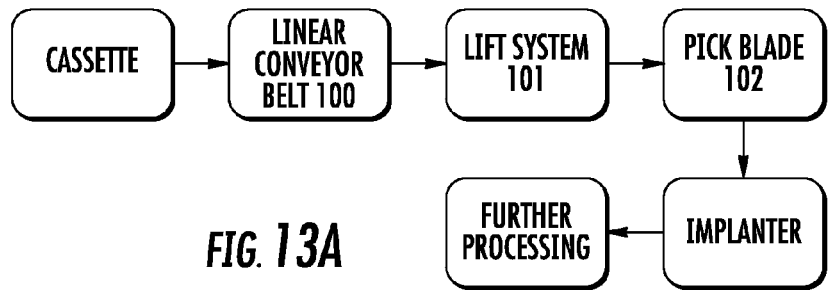
FIG. 13a is a process flow illustrating exemplary steps involved in one embodiment of an ion implantation process.

FIG. 13a is a process flow illustrating one embodiment of the invention, where a workpiece handling system is used in conjunction with an ion implantation process. A workpiece 104 is moved from the cassette to the linear conveyor belt 100, lift system 101, pick blade 102, and implanter. After implantation, the workpieces 104 are removed from the implanter and may be processed further. In particular embodiments discussed below, both the lift system and pick blade are arranged to contain two dimensional matrices of workpieces during handling. However, other arrangements are possible in accordance with the present invention.

Figure 3B:
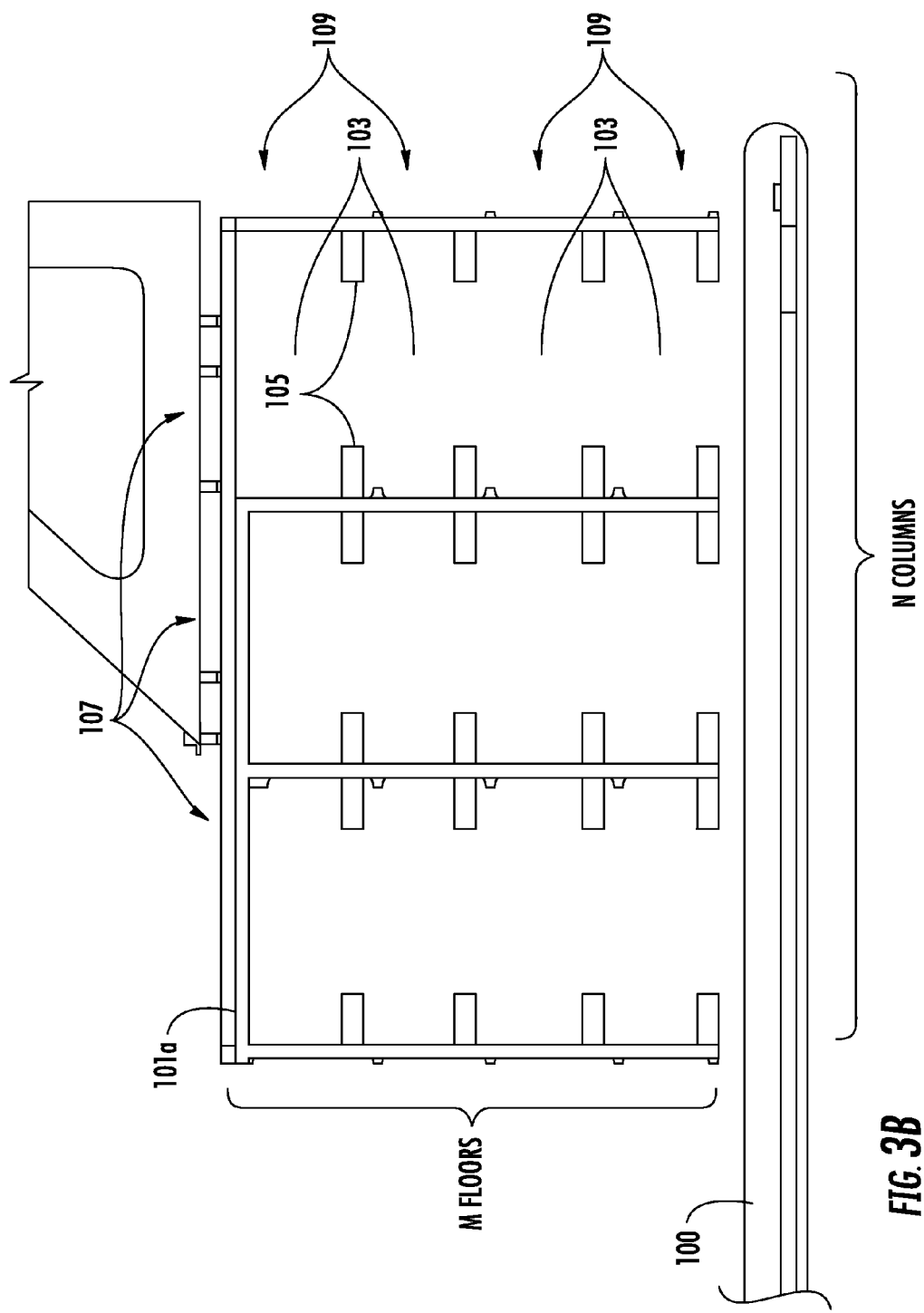
FIG. 3b is a side view of a portion of an exemplary workpiece handling system.

Configurations of the present invention, such as that depicted in FIG. 3a, may employ a 1×N×M lift system 101 (or "hotel"), where N is the number of vertical columns in the hotel and M is the number of "floors" in the hotel. FIG. 3b is a side view of a portion of an exemplary workpiece handling system 101a showing the hotel arranged in a matrix of N columns 107 and M floors 109. The intersection of a column 107 and floor 109 defines a cell 103 (or room), whose lower portion is bounded by a substrate holder that comprises substrate supports 105, as shown. As used herein, the term "floor" refers to a set of generally horizontally adjacent cells that span the horizontal width of the hotel along the "b" direction. Each floor includes substrate supports 105 and the space above the substrate supports. The hotel floors in the configuration of the invention depicted in FIG. 3b are flat, that is, the supports (lips) 105 are disposed at the same vertical position in horizontally adjacent rooms 103. However, in other configurations of the invention, the floors are staggered, as detailed below with respect to FIGS. 5a-12.

Returning to FIG. 3a, lift system 101 is configured to interact with the linear conveyor belt 100 and a Y×Z pick blade 102, where Y is the number of columns and Z is the number of rows of a substrate matrix that can be accommodated by pick blade 102. The workpieces 104 are loaded onto the linear conveyor belt 100 from the cassette (not illustrated). The linear conveyor belt 100 transports the workpieces 104 to the lift system 101 in a 1×X array. Thus, the linear conveyor belt 100 is only one workpiece 104 wide in this particular embodiment. Linear conveyor belt 100 has a width T, which is less than the inner width W between opposed support features 105 (discussed further below) of hotel cell 103. Thus, when hotel 101 is empty or not completely full, an empty portion 100a of conveyor belt 100 can be inserted within an empty region of hotel 101 by lowering hotel 101 when portion 100a is directly beneath hotel 101. Subsequently, workpieces 104 can be transferred into hotel 101 along the "b" axis shown in FIG. 3a.

In one example of a loading operation requiring twelve substrates, the twelve substrates may be loaded from a cassette onto conveyor belt 100 in a 1×12 array. This array may be loaded onto an initially-empty lift system 101, which may be a 1×3×4 hotel that comprises twelve individual cells each configured to house one substrate. Accordingly, all the cells in the hotel may be filled by the 1×12 array received from conveyor belt 100. In general, conveyor belt 100 may support more or less substrates than can be accommodated by hotel 101. However, it will be apparent that an empty hotel 101 can only load a maximum of M×N substrates at any one time without interacting with pick blade 102 to unload substrates from hotel 101.

Figure 4:
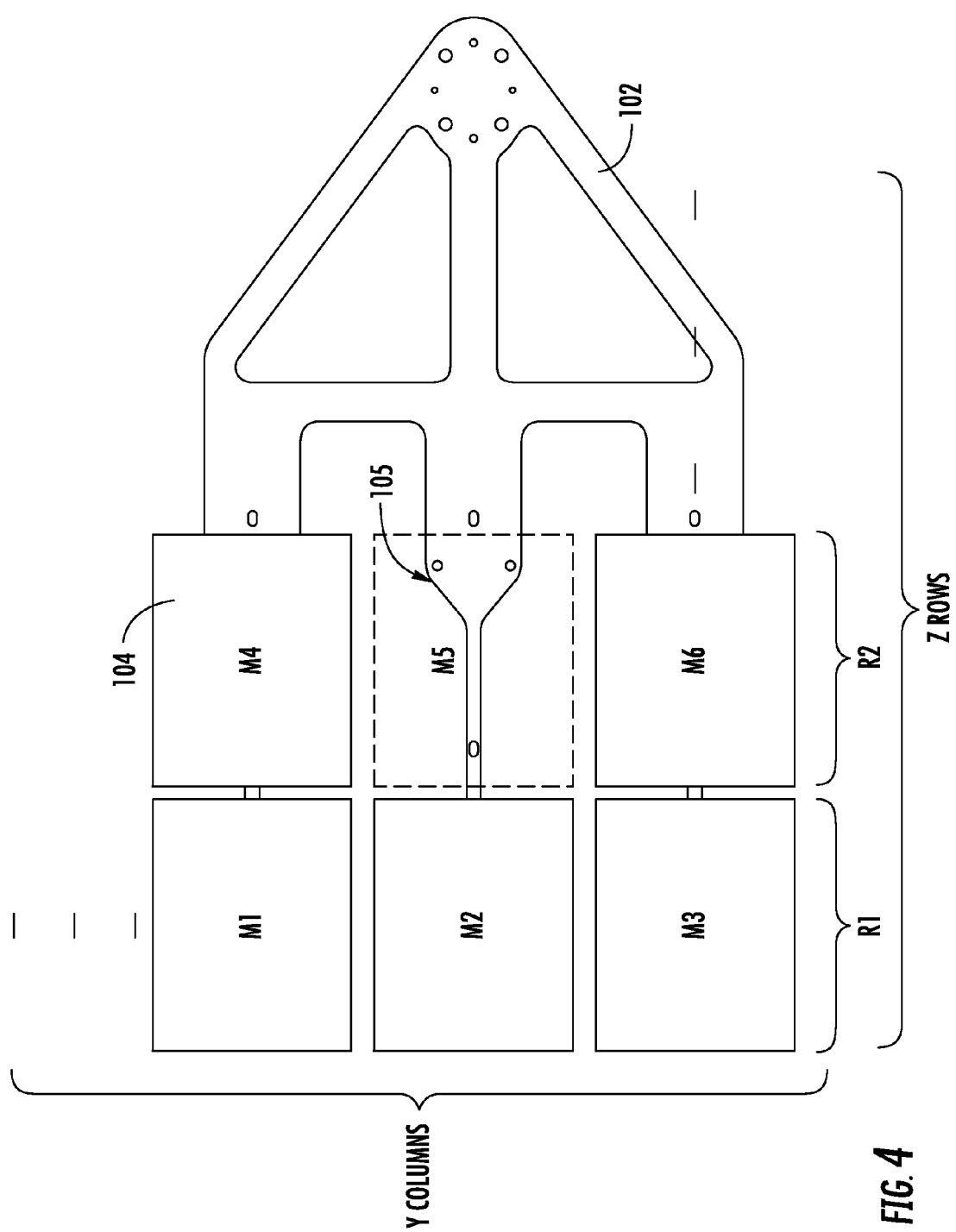
FIG. 4 is a schematic plan view of an exemplary pick blade having a missing workpiece.

FIG. 4 provides details of an arrangement of substrates 104 on an exemplary pick blade 102. In embodiments of the invention, the number of hotel columns N, may, but need not, equal the number of pick blade columns Y, and in some embodiments the number of hotel floors M, may, but need not, equal the number of pick blade rows Z.

In embodiments of the present invention, wafer handling system 10 is configured to provide a relative motion between pick blade 102 and lift system 101 along both the "a," "b," and the "c" directions, as indicated in FIG. 3a. These directions may define a set of mutually orthogonal axes that are parallel to the vertical and short horizontal directions, respectively, of hotel 101. Pick blade 102 may also be configured to rotate, for example, within the a-b plane. The pick blade 102 is thus operable to insert into the lift system 101 generally along the "c" axis, in a manner that allows individual arms 102a to insert within respective columns 107. In addition, lift system 101 is configured to lower workpieces 104 from a given hotel cell onto the pick blade 102 either by a downward motion of the hotel, an upward motion of pick blade 102, or a combination of the two.

In examples in which the number of hotel columns N equals the number of pick blade columns Y, pick blade 102 may unload at one time an entire hotel "floor" of substrates, which denotes all the substrates in a set of cells of the floor, such as that defined by wafers 20 in FIG. 3*a*. The handling system 10 is configured to repeat this operation. For example, to ensure proper spacing between rows of workpieces on the pick blade, after the initial floor of workpieces 104 is lowered onto pick blade 102, the pick blade 102 may retract along the "c" axis for a distance equivalent to about one workpiece width or greater. Subsequently, more workpieces 104 from another hotel floor may be lowered onto the pick blade 102. This process can be repeated in a "floor-by-floor" fashion to create a Y×Z matrix of workpieces 104 on the pick blade 102, which is equivalent to an N×Z matrix, since the number of pick blade arms 102*a* (e.g. three columns) equals the number of columns 107 in this example. If the pick blade can accommodate all M floors of substrates (where M is the number of hotel floors), then the hotel-to-pick blade transfer process can transfer a full vertical matrix of hotel substrates into a horizontal matrix on the pick blade.

In one example of substrate transfer to the pick blade, lift system 101 may contain three columns and four floors, and may be configured to house up to 12 substrates at a time, as depicted in FIG. 3*a*. For a given implantation requiring six substrates, a total of six substrates may be loaded into two floors of lift system 101, leaving two floors empty. Subsequently, lift system 101 may lower two 1×3 lines (floors) of workpieces 104 from the two full floors onto pick blade 102 to make a 2×3 matrix of workpieces.

In a further example in which lift system 101 contains three columns and four floors, as in FIG. 3, pick blade 102 may be configured to accommodate three columns of workpieces (Y) arranged in a matrix having a maximum of three rows (Z). Accordingly, if the workpiece hotel is full (12 substrates), the pick blade may select a matrix of three columns and three rows from the workpiece hotel, by unloading, for example, all workpieces from three floors of the workpiece hotel. This leaves an "extra" floor of three workpieces, which may be available for a subsequent loading operation onto pick blade 102.

More generally, embodiments of the present invention provide a workpiece handling system where the number of lift system columns N defines the maximum number of substrates that can be transferred to the pick blade in a single row and the number of lift system floors M defines the maximum amount of rows that may be transferred to the pick blade without refilling the hotel if not otherwise limited by the pick blade capacity via the number of arms 102*a*. In order to ensure that the pick blade can be fully loaded in a single operation, the number of hotel columns in a lift system may, but need not, match or exceed the number arms in the pick blade and the number of floors of the lift system may, but need not, match or exceed the number of rows of workpieces that the pick blade can accommodate.

Referring again to FIG. 3*a*, after receiving wafers from the lift system 101, the pick blade 102 can transfer a Y×Z matrix of workpieces 104 onto a platen or other apparatus in an implanter. Such a system can deliver the desired number of workpieces 104 to an implanter in a desired arrangement. This may be done with a minimum of broken or missing workpieces 104. As discussed further below, the system 10 also may operate to fill any section of the matrix on the pick blade 102 should a workpiece 104 be broken or missing to ensure a maximum throughput through an implanter.

In accordance with the present invention, the workpiece handling system 10 provides a system and method for flexibly and efficiently loading workpieces received in a linear fashion into a two dimensional matrix for processing in a process system, such as an ion implanter. By way of illustration, and referring once more to FIGS. 3 and 14, a substrate platen of an ion implanter may be configured to accommodate a maximum of two rows of workpieces by three columns of workpieces. An ion implantation job may specify a process in which twelve wafers are to be implanted and the full matrix of positions on the substrate platen 200 are to be occupied by each substrate to be subjected to the specific ion implantation process. Accordingly, each implantation procedure involves implanting a two by three matrix of substrates. To supply the required substrates to the implanter, a total of twelve substrates 104 may be loaded onto linear conveyor 100, which transports the substrates to lift system 101. It will be apparent that for belt-type and other similar embodiments of linear conveyor 100, the conveyor need not be configured to support all twelve substrates at the same time, since the substrates may be loaded in a serial fashion onto a belt portion of conveyor 100, which transports the substrates into position for loading. The twelve substrates are then loaded into lift system 101, such that four three-column floors are fully loaded with the substrates. Pick blade 102 thereafter receives a first two-by-three matrix of substrates from two floors of lift system 101 and transfers the matrix of substrates to platen 200 for a first implantation under the given implantation conditions. This process may be repeated to load the remaining two-by-three matrix of substrates from the remaining two floors of lift system 101 into the implanter, after which a second implantation is performed using the same set of conditions, thereby completing the implantation job in an efficient manner.

In some embodiments of this invention, both the pick blade and workpiece hotel of the present invention are configured to accommodate at least as many workpieces as can be accommodated by a substrate platen, thereby facilitating loading of a full platen in a single loading operation. However, the present invention can be employed to load a platen that accommodates a substrate matrix that is larger than that accommodated on the pick blade, thereby requiring a plurality of loading operations to fully load the substrate platen.

In accordance with some embodiments of the present invention, a lift system, such as lift system 101, contains a staggered arrangement of cells that facilitates individual accessibility of cells of a lift system and of wafer positions on a pick blade. This individual accessibility feature denotes the ability to individually adjust positioning of a substrate in a given hotel cell independent of other substrates on a conveyor when loading from the conveyor into the hotel, and also denotes the ability to independently transfer a substrate from any cell of the hotel to any matrix position on the pick blade without disturbing other substrates in the hotel or pick blade.

FIGS. 4-8*b* are schematic depictions of an exemplary workpiece handling system that illustrates an exemplary method of filling a pick blade with a desired number of workpieces when workpieces are missing or broken. As previously indicated in FIG. 4, a 2×3 matrix of workpieces 104 at positions M1-M6 is desired on the pick blade 102, but there is a gap 105 due to a broken or missing workpiece 104 in row R2 at position M5. As illustrated in FIG. 5*a*, in this embodiment, the lift system 101 is staggered to allow simultaneous pick and placement of workpieces 104 onto the pick blade 102 as well as independent placement of workpieces 104 into specific spots on the pick blade 102. In particular, as shown in FIG. 5*a*, each given hotel "floor" 1-4 is generally slanted such that the support members 3*a-c* in cells in adjacent columns are staggered at different vertical heights. As seen in FIGS.

5a-8b, the lift system 101 can lower a workpiece 104 into any gap 105 by having extra workpieces 104 that can be individually selected by pick blade 102.

In particular, each pair of FIGS. 5a,b-8a,b depicts operation of a pick blade and lift system at different stages of a loading operation in which a single workpiece 104 is transferred from lift system 101 to a single open position 105 of pick blade 102, while other workpieces 104 remain undisturbed in both the pick blade and lift system. FIG. 5a depicts a cross-sectional view of lift system 101, which includes staggered floors 1-4, in which all of floor 2 is occupied by substrates. As illustrated in the plan view of FIG. 5b, pick blade 102, which has a missing substrate in the center column of row R2, is retracted away from lift system 101.

Subsequently, as depicted at FIGS. 6a and 6b, pick blade 102 is translated upwardly in the "a" (vertical) direction with respect to lift system 101. Pick blade 102 is also indexed along the "b" direction as needed, such that the position of missing substrate 105 aligns horizontally along the "b" direction with cell 2b of lift system 101. Pick blade 102 is also inserted along the "c" direction such that row R2 of pick blade 102 is directly under substrates 104 of floor 2 of lift system 101. Notably, the individual vertical position of cells 2a-2c in floor 2 is substantially staggered between columns, which allows pick blade 102 to be inserted above a substrate 104 in cell 2a and below a substrate 104 in cell 2b (and below an additional substrate 104 in cell 2c).

Figure 7B:
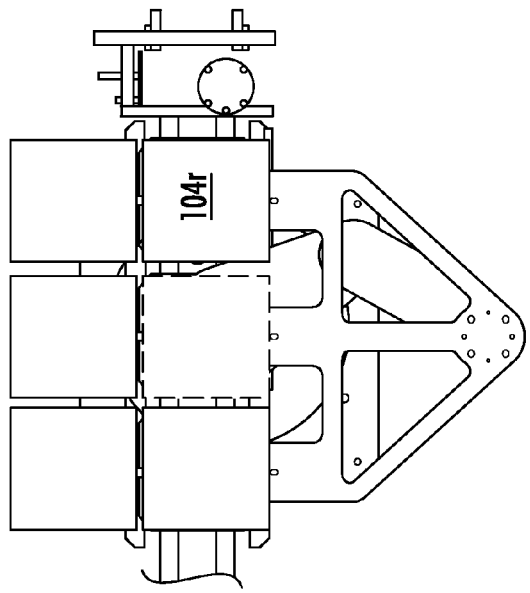
FIGS. 7a and 7b are schematic side and plan views, respectively, of the exemplary workpiece handling system of FIG. 5a when the hotel is lowered while the pick blade is inserted in the hotel.
Figure 7A:
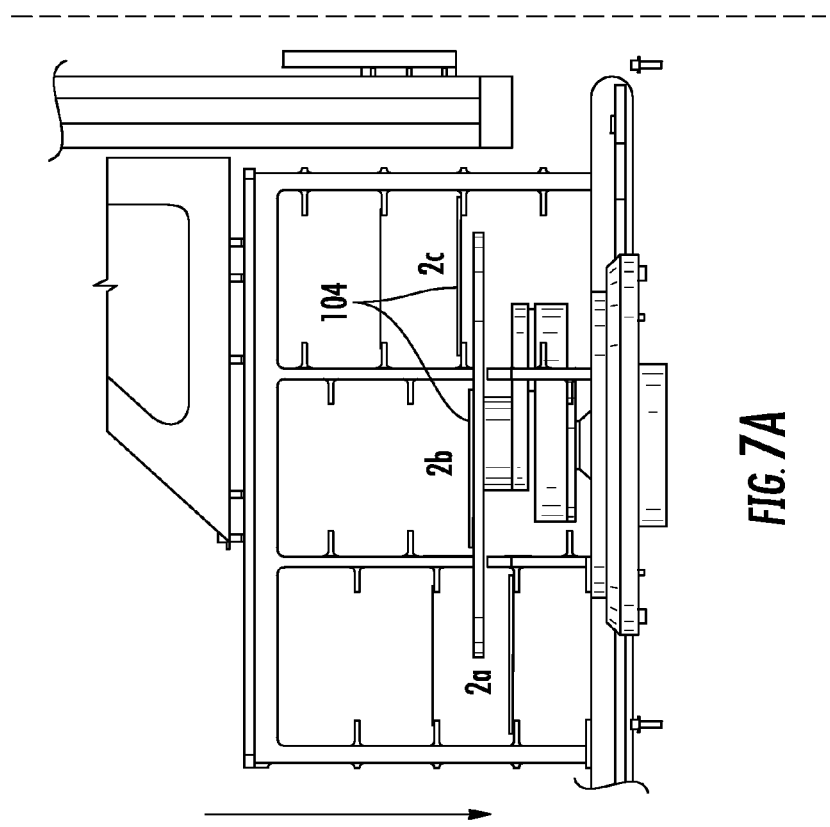

After insertion of pick blade 102 into lift system 101, the lift system is lowered with respect to the pick blade 102, as depicted in FIGS. 7a, 7b. The lowering action causes pick blade 102 to engage substrate 104 in cell 2b and to lift the substrate from supports in cell 2b, such that the substrate 104 rests exclusively on pick blade 102. Because of the stagger arrangement between cells 2b and 2c, the relative downward motion of lift system 101 can be sufficient to pick up substrate 104 in cell 2b before pick blade 102 encounters substrate 104 in cell 2c, as also illustrated in FIG. 7a. This prevents the supports or substrate 104 in cell 2c from striking an existing substrate (designated as 104r in FIG. 7b) already resting on pick blade 102.

Figure 8B:
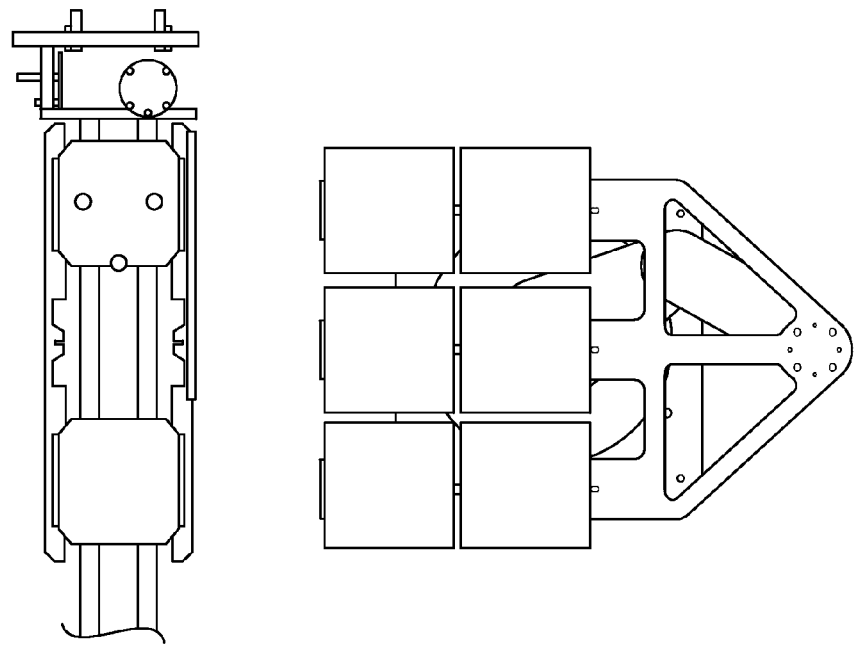
FIGS. 8a and 8b are schematic side and plan views, respectively, of the exemplary workpiece handling system of FIG. 5a when the pick blade is retracted from the hotel after receiving a workpiece in the missing workpiece position.
Figure 8A:
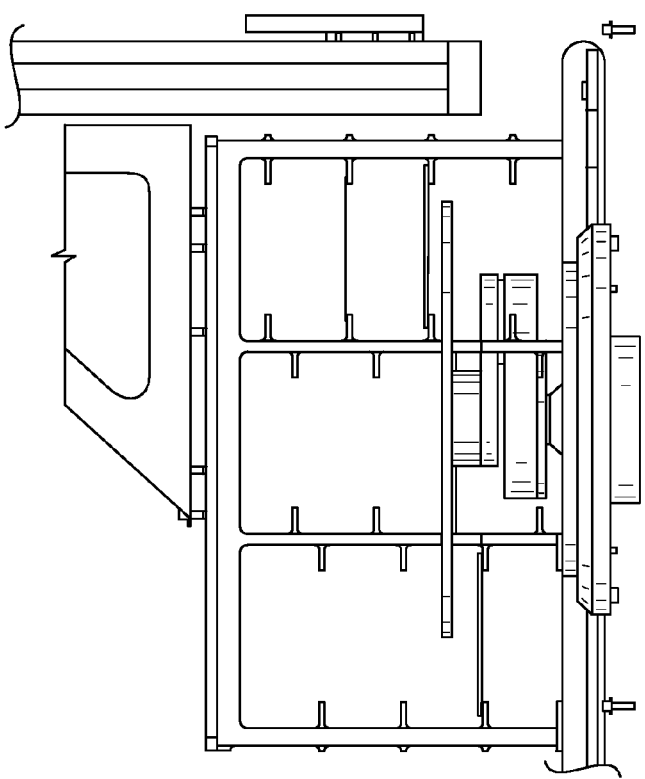
Figure 9:
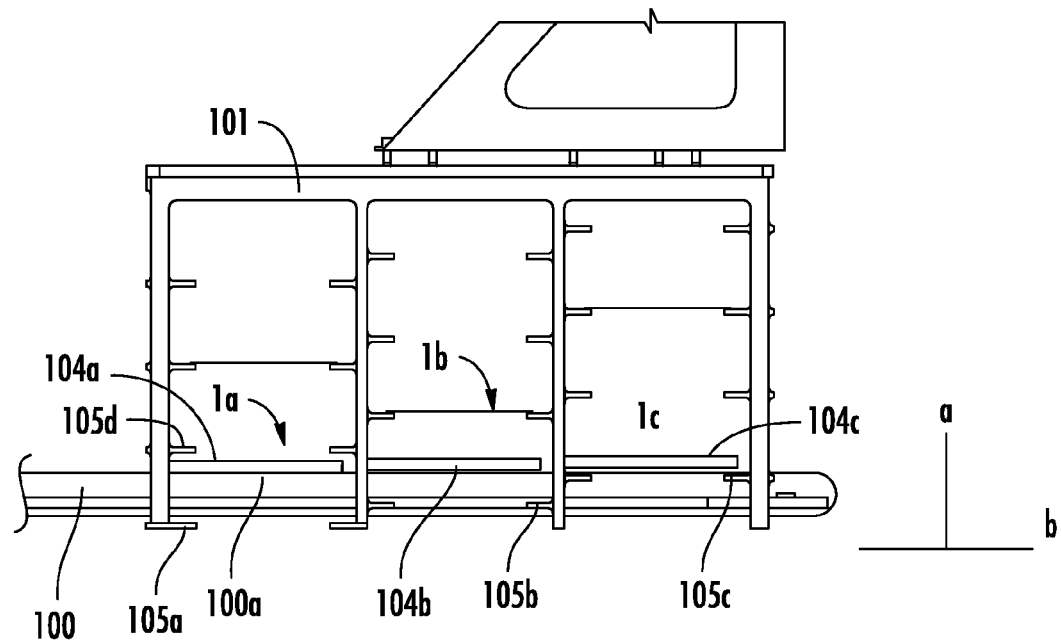
FIG. 9 is a schematic side view of an exemplary workpiece handling system including a conveyor and staggered hotel before loading wafers from the conveyor into the hotel.

Subsequently, pick blade 102 is retracted from lift system 101 with a full complement of substrates including a new substrate in the formerly empty position, as shown in FIGS. 8a and 8b.

It is to be noted that the process in accordance with the embodiment of the invention of FIGS. 4-8b can be performed to replace any number of missing substrates distributed over any set of matrix position(s) of the substrate matrix positions M1-M6 (see FIG. 4). Referring again to FIG. 6a, this aspect of the invention is facilitated by appropriate choice of the combination of the cell height "h" and the stagger "S" between adjacent supports 105 of lift system 101. In the embodiment detailed above with respect to FIGS. 4-8b, the combination of S and h is configured to provide sufficient space for pick blade 102 to be inserted into lift system 101 and to lift the desired substrate off supports of a chosen cell without colliding with any substrate 104 or substrate support 105. In some configurations of the invention, this may require that the stagger S between adjacent cells be equal to or greater than the sum of the pick blade thickness and substrate thickness (not shown).

FIGS. 9-12 are schematic side views of a hotel and conveyor of an exemplary workpiece handling system that together illustrate an arrangement and method in which a staggered lift system is used to independently set workpiece spacing. In particular, workpieces 104 may be independently spaced on the lift system 101 after being received from the linear conveyor belt 100. This may prevent workpieces 104 from falling out of the lift system 101. If any workpiece 104 is misaligned on the linear conveyor belt 100, the lift system 101 can compensate and align the workpieces 104 on the lift system 101. Using a lift system 101 that is staggered assists in alignment, though other designs of the lift system 101 than that illustrated herein are possible.

Referring again to FIG. 3a, as noted previously, the width T of conveyor 100 is less than the separation W between opposed supports 105, such that an empty portion 100a can be initially placed within hotel 101. Subsequently, in the initial stages of substrate loading, illustrated in FIG. 9, conveyor belt 100 horizontally transports a set of three substrates 104 into previously unoccupied region 100a to a position of rough alignment with respective hotel cells 1a, 1b, and 1c. The conveyor belt 100 is also positioned at a height such that the outer edges of wafers 104a-c are above respective staggered supports 105a-c (see FIG. 5b for a general depiction of the alignment of outer edges of wafers 104 and hotel supports). The height of conveyor belt 100 is also such that the substrate 104 in cell 1a does not strike the lower surface of support 105d in the cell above.

Figure 10:
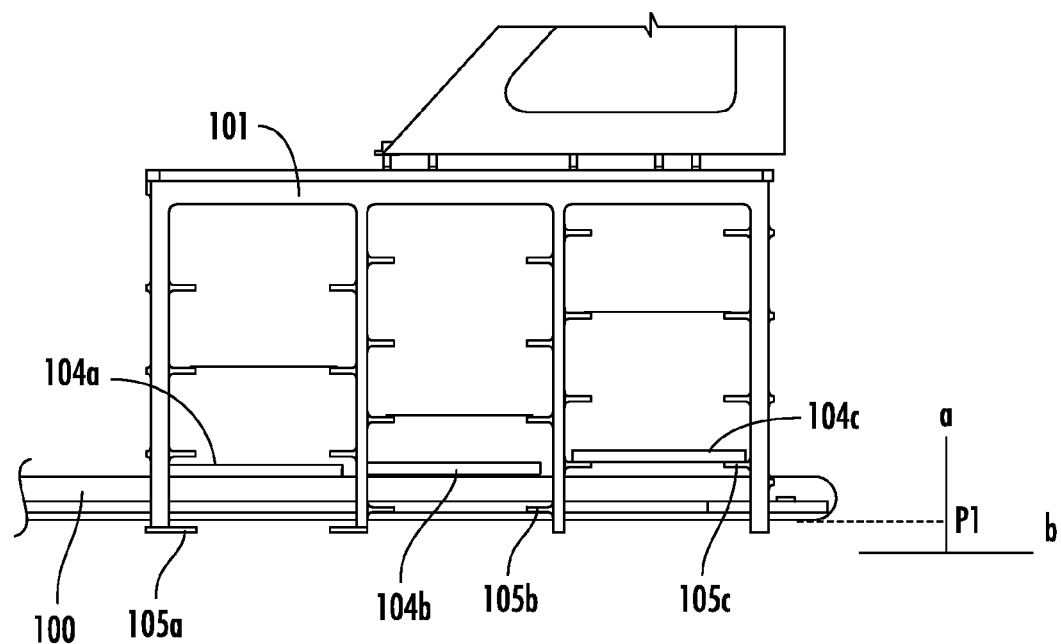
FIG. 10 is a schematic side view of the exemplary workpiece handling system of FIG. 9, after a first workpiece is loaded into a first hotel cell.

FIG. 10 illustrates a subsequent exemplary step in which lift system 101 is raised along the "a" direction with respect to conveyor belt 100, to a level P1 at which point supports 105c engage substrate 104c. Once the substrate 104c comes into contact with lift system 101, fine adjustments to the substrate position may be performed using means such as push-rods or other mechanisms (not shown). This facilitates optimal placement of wafer 104c within cell 1c. Notably, as illustrated in FIG. 10, during placement of substrate 104c, substrates 104a and 104b remain suspended above their respective cell supports and need not be optimally aligned within their respective cells.

Figure 11:
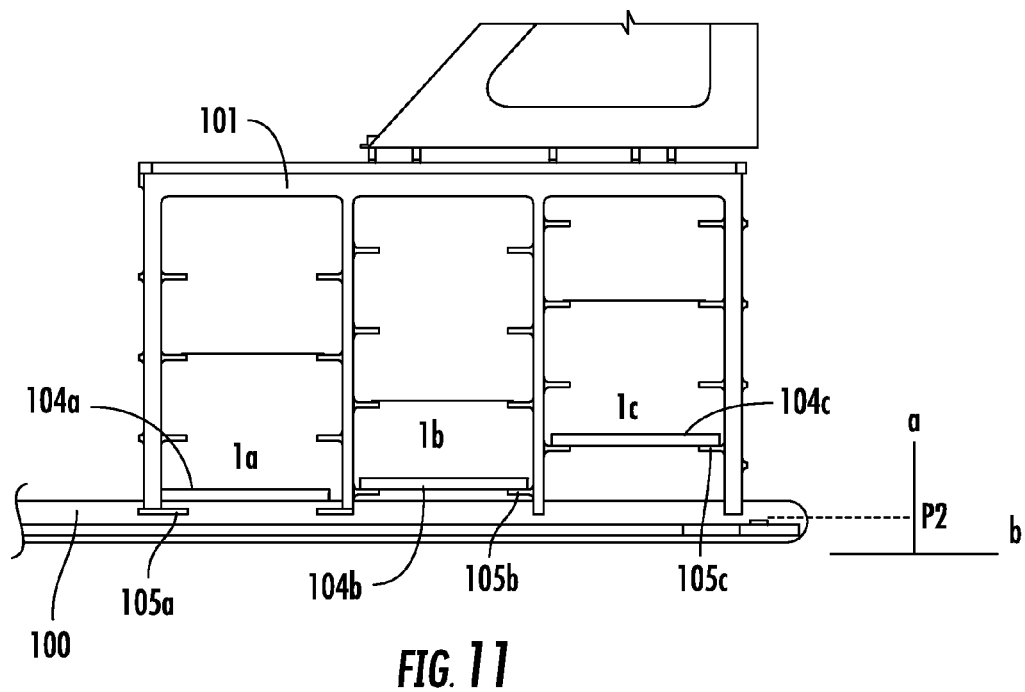
FIG. 11 is a schematic side view of the exemplary workpiece handling system of FIG. 9, after a second workpiece is loaded into a second hotel cell.

FIG. 11 illustrates a subsequent exemplary step in which lift system 101 is raised along the "a" direction with respect to conveyor belt 100, to a level P2 at which point supports 105b engage substrate 104b. As with substrate 104c, once substrate 104b comes into contact with lift system 101, fine adjustments to the substrate position may be performed to facilitate optimal placement of wafer 104b within cell 1b. Notably, as illustrated in FIG. 11, during placement of substrate 104b, substrate 104a remains suspended above its cell supports and need not be optimally aligned within cell 1a.

Figure 12:
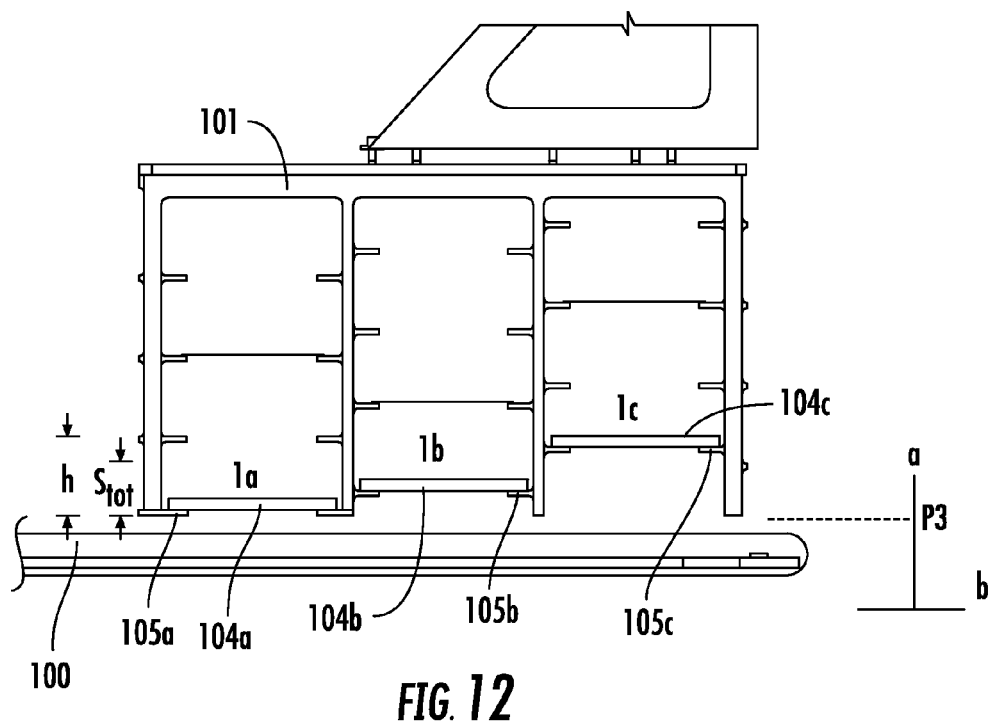
FIG. 12 is a schematic side view of the exemplary workpiece handling system of FIG. 9, after a third workpiece is loaded into a third hotel cell.

FIG. 12 illustrates a subsequent exemplary step in which the bottom of lift system 101 is raised along the "a" direction with respect to conveyor belt 100, to a level P3, at which point supports 105a engage substrate 104a. As with substrates 104c and 104b, once the substrate 104a comes into contact with lift system 101, fine adjustments to the substrate position may be performed to facilitate optimal placement of wafer 104a within cell 1a.

In the embodiment detailed above with respect to FIGS. 9-12, the combination of S and h is configured to provide sufficient space for conveyor 100 to be inserted into lift system 101, to transport substrates 104 into rough alignment within respective cells 1a-1c, and to place each substrate on respective supports 105a-c of the given cell 1a-c. In some configurations of the invention, this may require that the sum of staggers between each set of adjacent cells across all the columns of the lift system, $S_{tot}$, be less than the cell height h, as indicated in FIG. 12.

In some embodiments of the present invention, a workpiece processing system includes a loading and an unloading workpiece handling system that may each be configured, for example, similar to system 10 of FIG. 3a. In one embodiment, a first workpiece handling system is configured to load a processing station, such as an ion implantation system, and a second workpiece handling system is configured to unload the processing station. The workpiece processing system may be configured such that the order that workpieces are received for processing is preserved after the processing step, which may be crucial for correctly processing of workpieces.

Figure 13B:
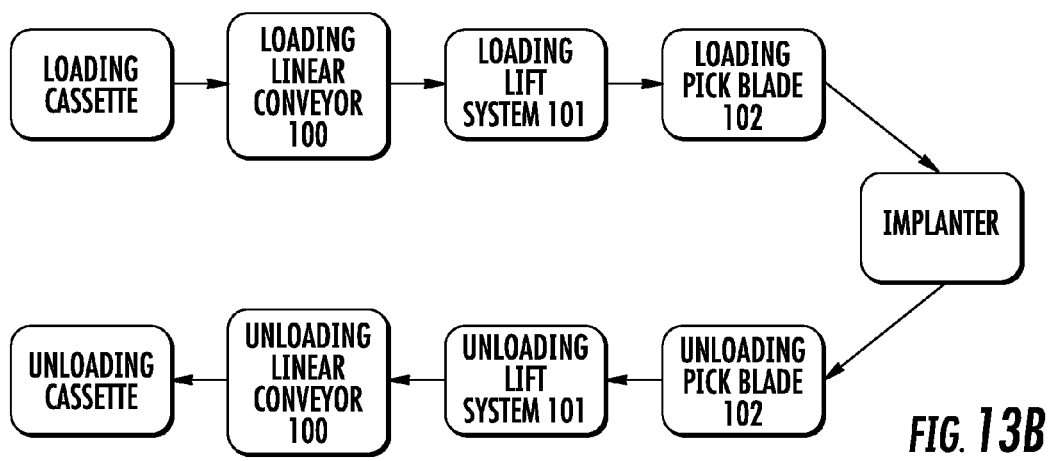
FIG. 13b is a process flow illustrating exemplary steps involved in another embodiment of an ion implantation process.

FIG. 13b is a process flow illustrating exemplary steps involved in a workpiece handling process for an ion implantation process, according to an embodiment of the present invention that employs both a loading and unloading workpiece handling system. In this context, the terms "loading" and "unloading" refer to a set of operations performed to transport workpieces to an implantation station before ion implantation, and a set of operations performed to transport workpieces from an implantation station after ion implantation, respectively.

In accordance with the process of FIG. 13b, a workpiece 104 may be moved from a loading cassette (not shown in the figures) to a loading linear conveyor belt 100, thence to a loading lift system 101, thence to a loading pick blade 102, and to an implantation station. After implantation, the workpieces 104 may be moved to an unloading pick blade 102, thence to an unloading lift system 101, thence to an unloading linear conveyor belt 100, and to an unloading cassette (not shown in the figures). In embodiments of the invention, the unloading and loading components may be the same components, or, alternatively, the loading components may constitute a loading system that is separate from an unloading system's components.

The process of FIG. 13b, may be implemented, for example, to process a set of solar cell workpieces (wafers) that are loaded into a loading cassette (not shown) for ion implantation processing. The individual wafers may have been subject to different treatments or may be scheduled for differing treatments, such that it is desirable to unload the wafers after ion implantation into an unloading cassette in the same order as received from the loading cassette. By providing a "stair step" hotel configuration, the wafers can be loaded before implantation in the following manner: wafers are loaded sequentially onto a linear conveyor according to the order in the loading cassette; wafers are loaded from the linear conveyor into the hotel in a "stair-step" sequence in which the first wafer to arrive from the linear conveyor is loaded into a first step, the second wafer is loaded into a second step, etc.; the wafers are transferred to a loading pick blade in a matrix in which each matrix position corresponds to a given step (cell) in the hotel. In this manner, the wafer order is preserved on the loading pick blade. Wafers are subsequently loaded into an implantation chamber and subjected to the desired implantation process(es). The wafers are subsequently transferred to an unloading pick blade and transferred to an unloading hotel that is configured in staggered fashion similar to the loading hotel. Wafers transferred to a subsequent unloading conveyor and unloading cassette are transferred in an order that preserves the original sequence of wafers in the loading cassette.

The systems and methods of the present invention may use various sensors and process control mechanisms to enable proper placement of the workpieces 104. Thus, laser systems, IR sensors, or other sensors may be used. A controller may be connected to all the components of the system to operate the system and provide process control.

The speed of the various components of this system may be varied as is known to those skilled in the art. Moreover, the relative motion between components of the workpiece handling systems of this invention described herein may be provided by any combination of motions of the individual components. Thus, for example, a lowering motion of a first component with respect to a second component could be achieved by raising the second component or lowering the first component. Different types of workpieces 104 or groups of workpieces 104 that require different implants may be run using embodiments of this system. This system may be expanded to incorporate more components disclosed herein to increase production speed.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of selectively placing a substrate on a substrate holder, comprising;
    arranging a plurality of substrates having a substrate thickness in each of a plurality of columns of a lift system, wherein a first vertical position of a first substrate in a first cell of the lift system differs from a second vertical position of a second substrate in an adjacent cell;
    positioning, at a third vertical position different from the first and second vertical positions, a pick blade that contains a set of substrates distributed in a two dimensional substrate matrix on the pick blade, wherein the two dimensional substrate matrix on the pick blade comprises the substrates in at least two columns and at least two rows;
    arranging an empty substrate position of the two dimensional substrate matrix at a first horizontal position defined by the first cell of the lift system;
    inserting the pick blade into the lift system at the third vertical position;
    lowering the lift system, wherein the first substrate in the first cell comes to rest upon the pick blade in the empty substrate position; and
    withdrawing the pick blade containing the first substrate from the lift system.

2. The method of claim 1, wherein the pick blade is configured to transfer the substrates for loading into a two dimensional matrix on a substrate platen of an ion implantation system.

3. A system for transferring workpieces into a process chamber comprising:
    a workpiece hotel defined by a matrix of cells having a cell height and arranged in N columns and M floors, each of the cells configured to receive a workpiece, the workpiece hotel having a staggered structure in which a vertical level of each of the cells differs from a vertical level of a nearest cell in an adjacent column; and
    a pick blade comprising a plurality of arms that is configured to insert into the workpiece hotel and retract from the workpiece hotel, wherein the pick blade is operable to unload a plurality of the workpieces from a first of the M floors onto the plurality of arms of the pick blade, and to repeat the unloading operation to form a workpiece matrix comprising a plurality of rows of the workpieces disposed on the plurality of arms of the pick blade.

4. The system of claim 3, wherein a sum of staggers between each set of adjacent cells across the M floors is less than the cell height, such that a plurality of the workpieces can be individually loaded from a conveyor into each of the cells of one of the floors of the workpiece hotel by lowering the workpiece hotel with respect to the conveyor.

5. The system of claim 3, wherein the vertical level of the nearest cell in the adjacent column differs by an amount greater than a sum of a thickness of the workpiece and pick blade thickness, wherein the pick blade can load one of the workpieces from the workpiece hotel onto any position of the pick blade matrix.

6. The system of claim 3, wherein the workpiece matrix comprises at least two columns.

7. The system of claim 3, wherein the N columns comprise at least two columns.

8. A method of selectively placing a substrate on a substrate holder, comprising:
    arranging a plurality of substrates having a substrate thickness in each of a plurality of columns of a lift system, wherein a first vertical position of a first substrate in a first cell of the lift system differs from a second vertical position of a second substrate in an adjacent cell;
    positioning, at a third vertical position different from the first and second vertical positions, a pick blade configured to hold a set of substrates distributed in a two dimensional substrate matrix on the pick blade in a first row and a second row;
    inserting the pick blade into the lift system at the third vertical position;
    changing a vertical position of the lift system, wherein a first plurality of the substrates become disposed on the pick blade in the first row;
    moving the pick blade such that the pick blade is still disposed under the lift system; and
    changing a vertical position of the lift system, wherein a second plurality of the substrates become disposed on the pick blade in the second row adjacent to the first row.

9. The method of claim 8, wherein the two dimensional substrate matrix on the pick blade comprises at least two columns.

10. The method of claim 8, wherein the two dimensional substrate matrix on the pick blade comprises a number of columns equal to a number of the plurality of columns of the lift system.

11. The method of claim 8, wherein each of the substrates in one of the first row or the second row becomes disposed on the pick blade sequentially.

* * * * *